(12) United States Patent
Wang

(10) Patent No.: US 8,310,063 B2
(45) Date of Patent: Nov. 13, 2012

(54) SEMICONDUCTOR PACKAGE STRUCTURE AND MANUFACTURING PROCESS THEREOF

(75) Inventor: Meng-Jen Wang, Pingtung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 205 days.

(21) Appl. No.: 12/907,028

(22) Filed: Oct. 19, 2010

(65) Prior Publication Data

US 2012/0049339 A1 Mar. 1, 2012

(30) Foreign Application Priority Data

Aug. 25, 2010 (TW) .................................. 99128499 A

(51) Int. Cl.
*H01L 23/52* (2006.01)
*H01L 21/00* (2006.01)
(52) U.S. Cl. ......... 257/777; 257/E23.011; 257/E21.499; 438/107

(58) Field of Classification Search .................... None
See application file for complete search history.

(56) References Cited

U.S. PATENT DOCUMENTS

2005/0263869 A1 * 12/2005 Tanaka et al. .................. 257/686
* cited by examiner

*Primary Examiner* — Evan Pert
*Assistant Examiner* — Kevin Quinto
(74) *Attorney, Agent, or Firm* — Jianq Chyun IP Office

(57) ABSTRACT

A semiconductor package structure including a substrate, a first chip, a second chip, and an interposer is provided. The substrate has a carrying surface and an opposite bottom surface. The first chip disposed on the carrying surface has a first surface and an opposite second surface. The second surface faces the substrate. The first chip has a plurality of through silicon vias (TSVs) and a plurality of first pads and second pads on the first surface. The first pads are electrically connected to the corresponding TSVs. The TSVs are electrically connected to the substrate. The second chip disposed above the first chip exposes a portion of the first surface. The second chip is electrically connected to the corresponding TSVs. The interposer is disposed on the first surface. Top surfaces of the interposer and the second chip are substantially aligned with each other. The interposer is bonded to the second pads.

12 Claims, 8 Drawing Sheets

SEMICONDUCTOR PACKAGE STRUCTURE AND MANUFACTURING PROCESS THEREOF

CROSS-REFERENCE TO RELATED APPLICATION

This application claims the priority benefit of Taiwan application serial no. 99128499, filed on Aug. 25, 2010. The entirety of the above-mentioned patent application is hereby incorporated by reference herein and made a part of this specification.

BACKGROUND OF THE INVENTION

1. Field of the Invention

The present invention generally relates to a semiconductor package structure and a manufacturing process thereof, and more particularly, to a semiconductor package structure with through silicon vias (TSVs) and a manufacturing process thereof.

2. Description of Related Art

In a semiconductor packaging process, through silicon vias (TSVs) are formed to electrically connect dies and wafers vertically. The TSV technique is very important in connecting dies in 3-dimensional (3D) integrated circuits (IC). Compared to the conventional IC packaging techniques, the TSV technique offers a maximum 3D density, a smaller size, a higher speed, a reduced signal delay, and a lower power consumption. Thus, the TSV structure is considered a new-generation vertical interconnect structure applied to 3D IC technology.

To be specific, in a semiconductor packaging process, a semiconductor wafer is first thinned to expose the TSVs in a semiconductor wafer. The semiconductor wafer is then temporarily fixed on a carrier wafer. Next, uncut dies are bonded to the semiconductor wafer. After that, the semiconductor wafer is separated from the carrier wafer in order to perform subsequent processes on the semiconductor wafer. However, when the semiconductor wafer and the carrier wafer are separated, the semiconductor wafer may be deformed due to variation of structural stress. As a result, the production yield may be reduced.

SUMMARY OF THE INVENTION

Accordingly, the present invention is directed to a semiconductor package structure with improved structural strength.

The present invention is directed to a semiconductor packaging process that can prevent deformation of a semiconductor wafer.

The present invention provides a semiconductor package structure including a substrate, a first chip, a plurality of first conductive bumps, a second chip, a plurality of second conductive bumps, an interposer, and a plurality of third conductive bumps. The substrate has a carrying surface and a bottom surface opposite to the carrying surface. The first chip is disposed above the carrying surface of the substrate. The first chip has a first surface and a second surface opposite to the first surface, wherein the second surface faces the substrate. The first chip has a plurality of through silicon vias (TSVs) and a plurality of first pads and a plurality of second pads on the first surface, wherein the first pads are electrically connected to the corresponding TSVs. The first conductive bumps are disposed between the first chip and the substrate. The TSVs of the first chip are respectively electrically connected to the substrate through the first conductive bumps. The second chip is disposed above the first chip and exposes a portion of the first surface. The second conductive bumps are respectively disposed on the first pads. The second chip is electrically connected to the corresponding TSVs through the second conductive bumps. The interposer is disposed above the first chip and within the exposed portion of the first surface. A top surface of the interposer is substantially aligned with a top surface of the second chip. The third conductive bumps are respectively disposed on the second pads. The interposer is bonded to the second pads through the third conductive bumps.

According to an embodiment of the present invention, a side surface of the interposer is substantially aligned with a side surface of the first chip.

According to an embodiment of the present invention, the semiconductor package structure further includes a first underfill. The first underfill is filled between the first chip and the substrate and encapsulates the first conductive bumps.

According to an embodiment of the present invention, the semiconductor package structure further includes a second underfill. The second underfill is filled between the second chip and the first chip and encapsulates the second conductive bumps.

According to an embodiment of the present invention, the semiconductor package structure further includes a third underfill. The third underfill is filled between the interposer and the first chip and encapsulates the third conductive bumps.

According to an embodiment of the present invention, the semiconductor package structure further includes a plurality of solder balls disposed on the bottom surface of the substrate.

According to an embodiment of the present invention, the semiconductor package structure further includes a heat sink. The heat sink covers and is thermal bonded to the second chip and the interposer.

According to an embodiment of the present invention, the semiconductor package structure further includes a thermal conductive adhesive disposed between the heat sink and the second chip and between the heat sink and the interposer.

According to an embodiment of the present invention, the semiconductor package structure further includes a thermal conductive ring. The thermal conductive ring is disposed on the substrate and surrounds the first chip, and the thermal conductive ring is thermal bonded between the heat sink and the substrate.

According to an embodiment of the present invention, the heat sink is grounded.

The present invention provides a semiconductor packaging process. First, a semiconductor wafer is provided, wherein the semiconductor wafer has a second surface, and the semiconductor wafer has a plurality of TSVs. Then, a plurality of first conductive bumps is formed on the second surface, wherein the first conductive bumps are respectively electrically connected to the TSVs. The semiconductor wafer is thinned from an opposite side of the second surface to expose one end of each TSV and the first surface of the semiconductor wafer, wherein the other end of each TSV is connected to the first surface. A plurality of first pads and a plurality of second pads are formed on the first surface, wherein the first pads are electrically connected to the corresponding TSVs. A plurality of second chips is bonded to the first surface of the semiconductor wafer, wherein each of the second chips is electrically connected to the corresponding first pads through a plurality of second conductive bumps. A second underfill is formed between each of the second chips and the semiconductor wafer, wherein the second underfill is formed on the semiconductor wafer before each of the second chips is bonded to the semiconductor wafer or is filled between each of the second chips and the semiconductor wafer after each of the second chips is bonded to the semiconductor wafer, and the second underfill encapsulates the second conductive bumps. An interposer wafer is bonded to the first surface of the semiconductor wafer, wherein the interposer wafer has a plurality of openings respectively corresponding to and exposing the second chips, the interposer wafer is electrically connected to the corresponding second pads through a plurality of third conductive bumps, and a top surface of the interposer wafer is substantially aligned with top surfaces of the second chips. The interposer wafer and the semiconductor wafer are simultaneously cut to form a plurality of package units, wherein the semiconductor wafer is cut into a plurality of individual first chips, and the interposer wafer is cut into a plurality of individual interposers. The package units are bonded to a substrate, wherein the TSVs of the first chips are electrically connected to the substrate through the corresponding first conductive bumps.

According to an embodiment of the present invention, the semiconductor packaging process further includes forming a first underfill between the first chips and the substrate, wherein the first underfill is filled between the first chips and the substrate after the first chips are bonded to the substrate, and the first underfill encapsulates the first conductive bumps.

According to an embodiment of the present invention, the semiconductor packaging process further includes forming a third underfill between the interposer wafer and the semiconductor wafer, wherein the third underfill is formed on the semiconductor wafer before the interposer wafer is bonded to the semiconductor wafer or is filled between the interposer wafer and the semiconductor wafer after the interposer wafer is bonded to the semiconductor wafer, and the third underfill encapsulates the third conductive bumps.

According to an embodiment of the present invention, the semiconductor packaging process further includes disposing a heat sink on the package units, wherein the heat sink covers and is thermal bonded to the second chips and the interposer.

As described above, in the semiconductor packaging process provided by the present invention, an interposer wafer is disposed on a portion of a semiconductor wafer that is exposed by a plurality of second chips, so that the structural strength of the semiconductor package structure is improved and deformation of the semiconductor wafer caused by stress variation is avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
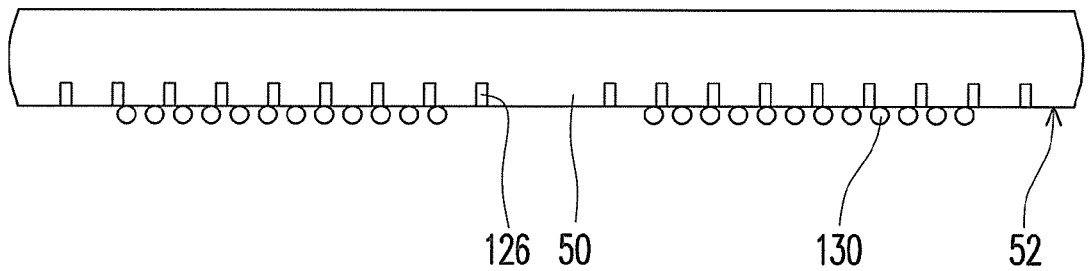
FIGS. 1A-1K illustrate a semiconductor packaging process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1K illustrate a semiconductor packaging process according to an embodiment of the present invention. Referring to FIG. 1A, first, a semiconductor wafer 50 is provided. The semiconductor wafer 50 has a second surface 52, and the semiconductor wafer 50 has a plurality of TSVs 126. A plurality of first conductive bumps 130 is formed on the second surface 52, wherein the first conductive bumps 130 are respectively electrically connected to the TSVs 126.

Figure 1B:
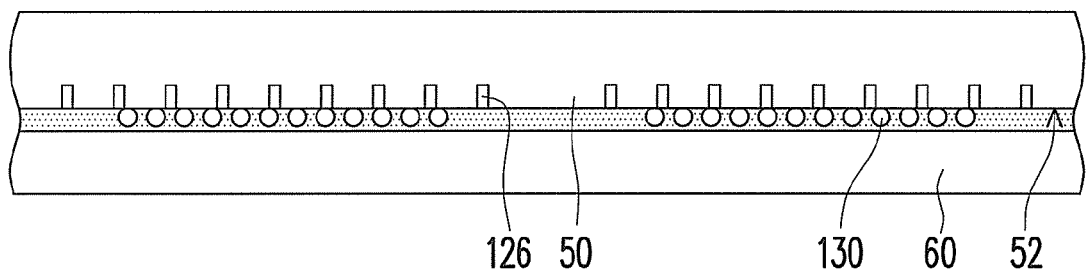
Figure 1C:
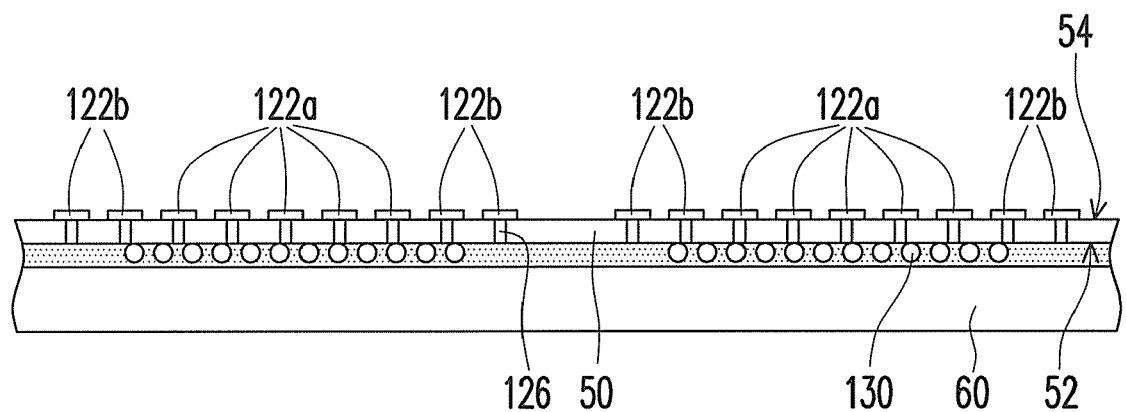

Then, as shown in FIG. 1B, the semiconductor wafer 50 and the first conductive bumps 130 in FIG. 1A are fixed on a carrier (for example, a carrier wafer 60). Referring to FIG. 1C, the semiconductor wafer 50 is thinned from the opposite side of the second surface 52 to expose one end of each TSV 126 and the first surface 54 of the semiconductor wafer 50. A plurality of first pads 122a and a plurality of second pads 122b are formed on the first surface 54, wherein the first pads 122a are electrically connected to the corresponding TSVs 126.

Figure 1D:
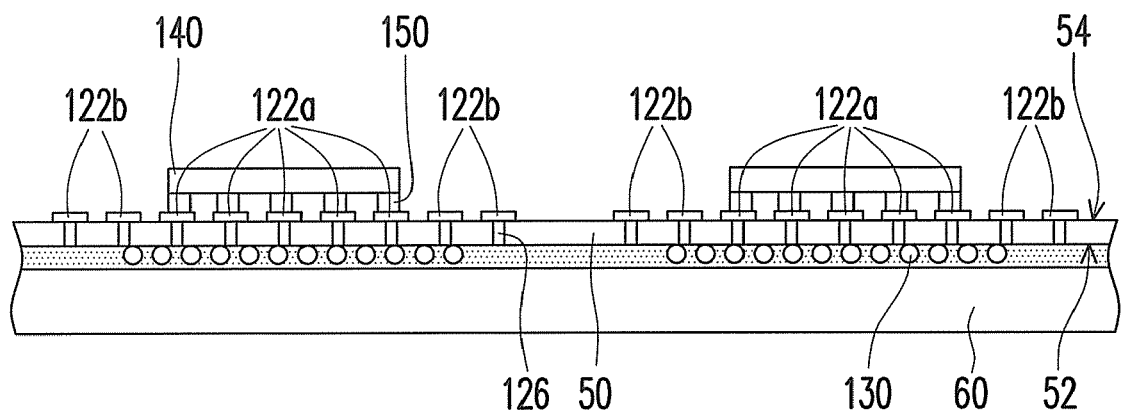
Figure 1E:
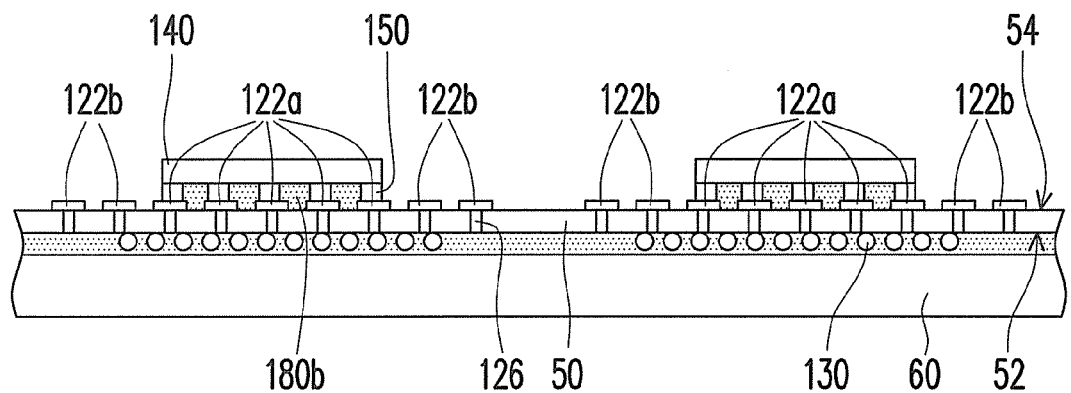

Referring to FIG. 1D, a plurality of second chips 140 is bonded to the first surface 54 of the semiconductor wafer 50, wherein each second chip 140 is connected to the corresponding first pads 122a through a plurality of second conductive bumps 150. Referring to FIG. 1E, a second underfill 180b is formed between each second chip 140 and the semiconductor wafer 50 to encapsulate the second conductive bumps 150. In the present embodiment, the second underfill 180b is filled between each second chip 140 and the semiconductor wafer 50 after each second chip 140 is bonded to the semiconductor wafer 50. However, the present invention is not limited thereto, and in another embodiment, the second underfill 180b may also be formed on the semiconductor wafer 50 before each second chip 140 is bonded to the semiconductor wafer 50.

Figure 1F:
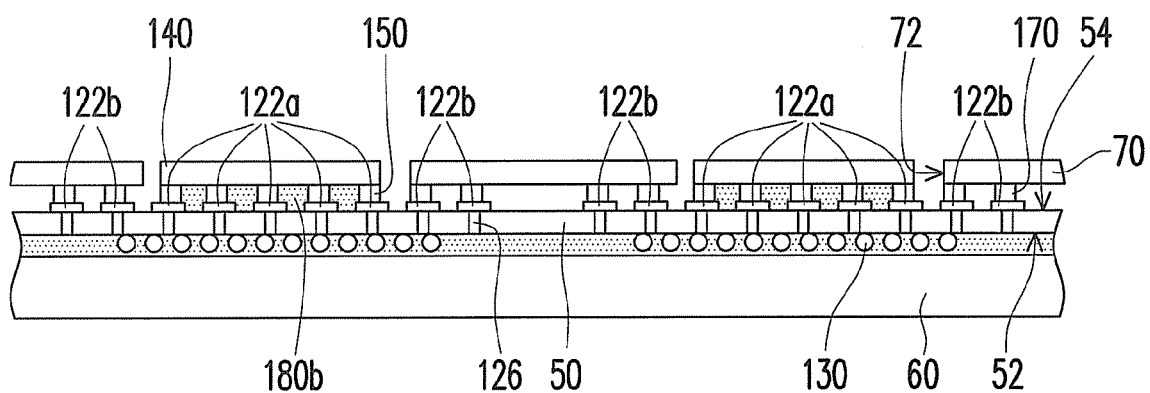
Figure 1G:
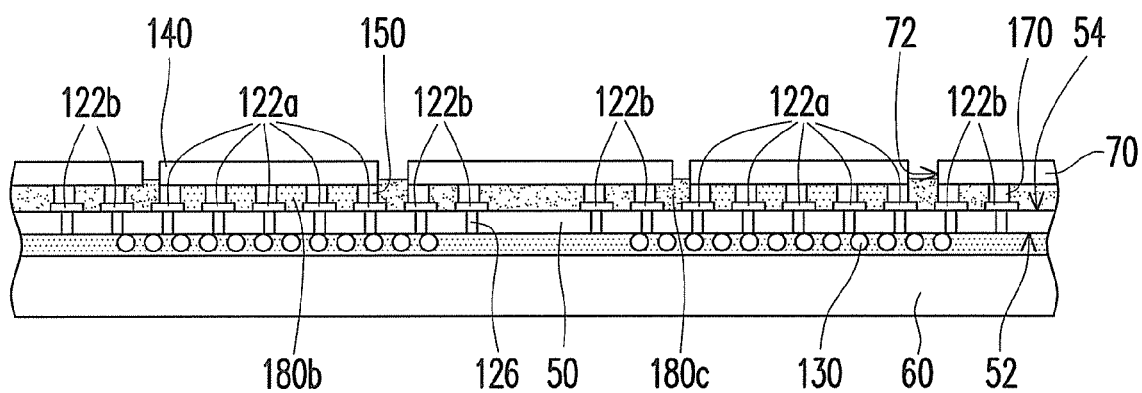
Figure 1H:
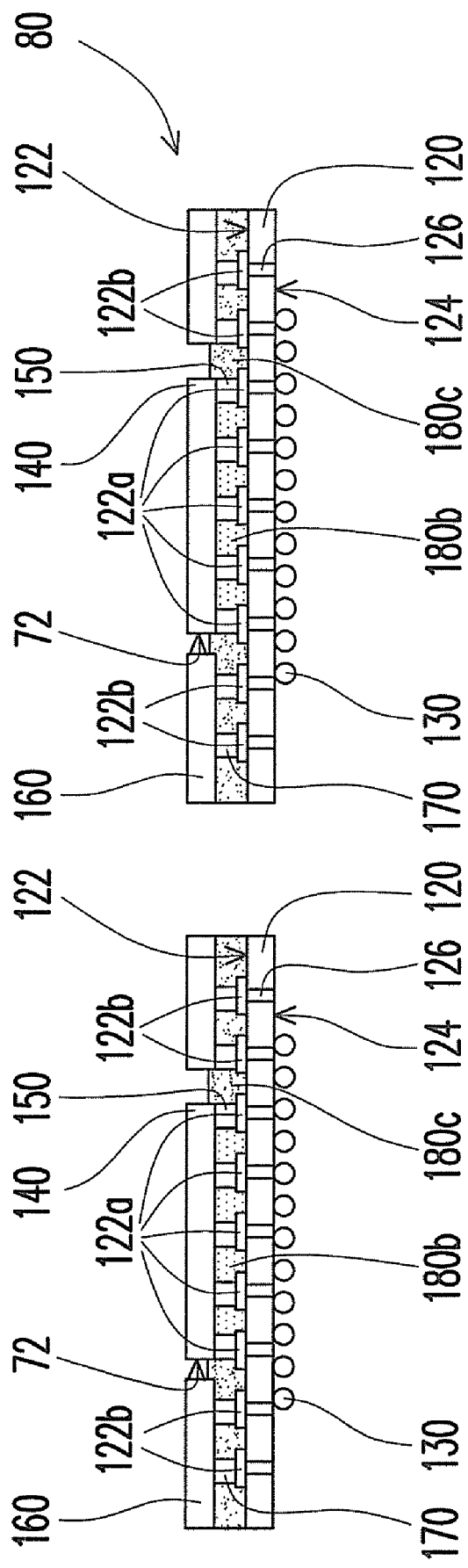
Figure 1I:
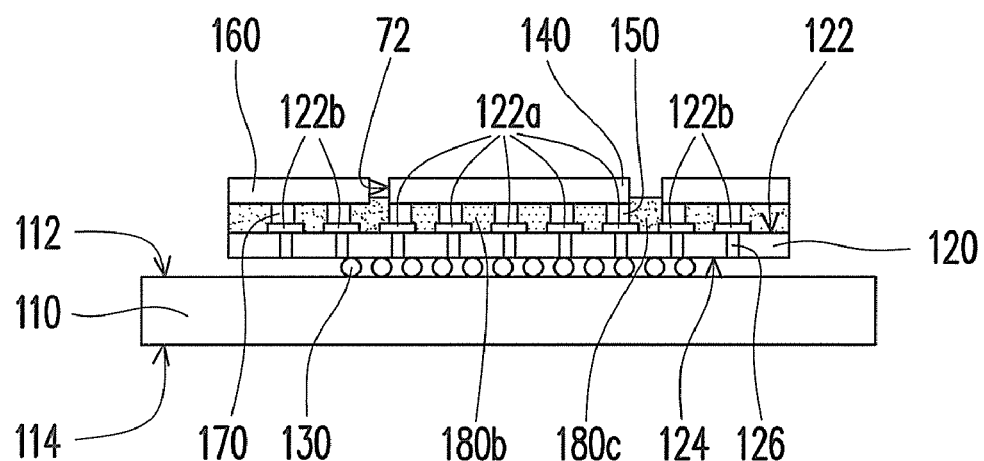
Figure 1J:
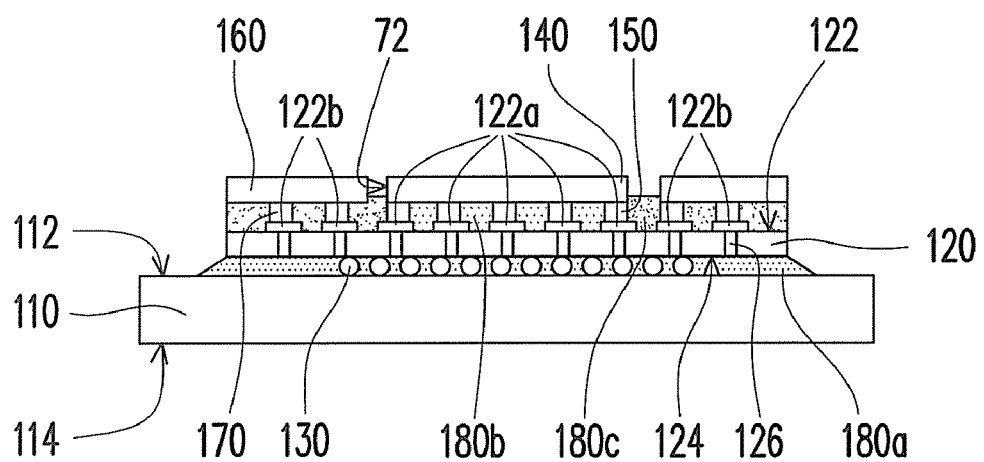
Figure 1K:
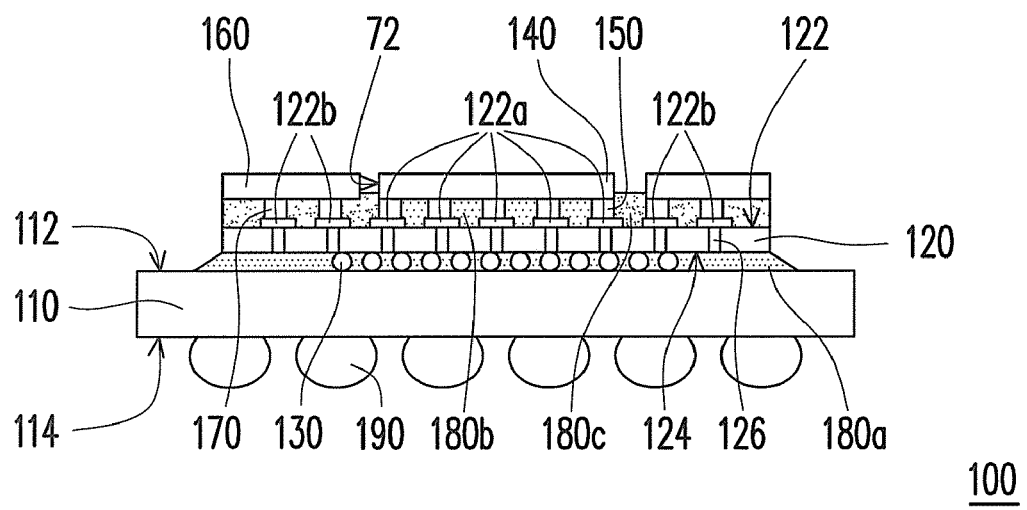
Figure 2:
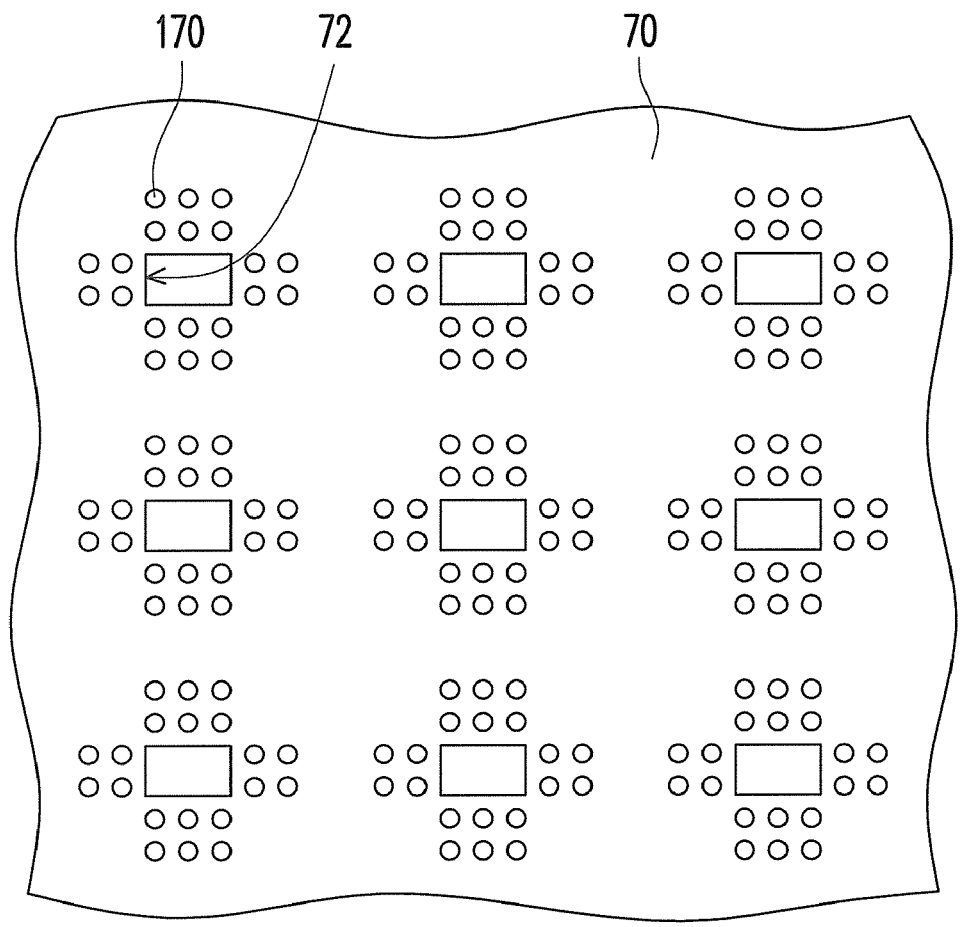
FIG. 2 is a diagram of an interposer wafer adopted in the semiconductor packaging process in FIGS. 1A-1K.

FIG. 2 is a diagram of an interposer wafer adopted in the semiconductor packaging process in FIGS. 1A-1K. Referring to FIG. 1F and FIG. 2, an interposer wafer 70 is bonded to the first surface 54 of the semiconductor wafer 50, wherein the interposer wafer 70 has a plurality of openings 72 respectively corresponding to and exposing the second chips 140. The interposer wafer 70 is electrically connected to the corresponding second pads 122b through a plurality of third conductive bumps 170, and the top surface of the interposer wafer 70 is substantially aligned with the top surfaces of the second chips 140. It should be noted that in other embodiments, the interposer wafer 70 may also be bonded to the semiconductor wafer 50 before the second chips 140 are bonded to the semiconductor wafer 50. However, the sequence for bonding the interposer wafer 70 and the second chips 140 is not limited in the present invention.

Referring to FIG. 1G, a third underfill 180c is formed between the interposer wafer 70 and the semiconductor wafer 50 to encapsulate the third conductive bumps 170. In the present embodiment, the third underfill 180c is filled between the interposer wafer 70 and the semiconductor wafer 50 after the interposer wafer 70 is bonded to the semiconductor wafer 50. However, the present invention is not limited thereto, and the third underfill 180c may also be formed on the semiconductor wafer 50 before the interposer wafer 70 is bonded to the semiconductor wafer 50. Besides, in the present invention, the third underfill 180c is not an essential element. Namely, the step of forming the third underfill 180c can be omitted.

Referring to FIG. 1H, the carrier wafer 60 is removed, and the interposer wafer 70 and the semiconductor wafer 50 are simultaneously cut to form a plurality of package units 80. Herein the semiconductor wafer 50 is cut into a plurality of individual first chips 120, and the interposer wafer 70 is cut into a plurality of individual interposers 160, wherein the side surfaces of the interposers 160 are substantially aligned with the side surfaces of the first chips 120. The semiconductor wafer 50 may be adhered to the carrier wafer 60. When the carrier wafer 60 is removed, the semiconductor wafer 50 may be deformed due to structural stress variation. The interposer wafer 70 disposed on the semiconductor wafer 50 can improve the structural strength of the entire semiconductor package structure and prevent or reduce deformation of the semiconductor wafer 50 when the semiconductor wafer 50 and the carrier wafer 60 are separated.

Referring to FIG. 1I, the package units 80 are bonded to the substrate 110, wherein the TSVs 126 of the first chips 120 are electrically connected to the substrate 110 through the corresponding first conductive bumps 130. Referring to FIG. 1J, a first underfill 180a is formed between the first chips 120 and the substrate 110 to encapsulate the first conductive bumps 130. The first underfill 180a is filled between the first chips 120 and the substrate 110 after the first chips 120 are bonded to the substrate 110. Referring to FIG. 1K, a plurality of solder balls 190 is disposed on a bottom surface 114 of the substrate 110. By now, the manufacturing of a semiconductor package structure 100 is completed.

The semiconductor package structure 100 includes a substrate 110, a first chip 120, a plurality of first conductive bumps 130, a second chip 140, a plurality of second conductive bumps 150, an interposer 160, a plurality of third conductive bumps 170, a first underfill 180a, a second underfill 180b, a third underfill 180c, and a plurality of solder balls 190. The substrate 110 has a carrying surface 112 and the bottom surface 114 opposite to the carrying surface 112. The first chip 120 is disposed above the carrying surface 112 of the substrate 110. The first chip 120 has a first surface 122 and a second surface 124 opposite to the first surface 122, wherein the second surface 124 faces the substrate 110. The first chip 120 has a plurality of TSVs 126 and a plurality of first pads 122a and a plurality of second pads 122b on the first surface 122.

The first pads 122a are electrically connected to the corresponding TSVs 126. The second pads 122b are also connected to the TSVs 126 to achieve an optimal heat dissipation effect. The first conductive bumps 130 are disposed between the first chip 120 and the substrate 110. The TSVs 126 of the first chip 120 are respectively electrically connected to the substrate 110 through the first conductive bumps 130. The second chip 140 is disposed above the first chip 120 and exposes a portion of the first surface 122. The second conductive bumps 150 are respectively disposed on the first pads 122a. The second chip 140 is electrically connected to the corresponding TSVs 126 through the second conductive bumps 150. The interposer 160 is disposed above the first chip 120 and within the portion of the first surface 122 exposed by the second chip 140.

The top surface of the interposer 160 is substantially aligned with the top surface of the second chip 140. The third conductive bumps 170 are respectively disposed on the second pads 122b. The interposer 160 is bonded to the second pads 122b through the third conductive bumps 170. The solder balls 190 are disposed on the bottom surface 114 of the substrate 110 so that the semiconductor package structure 100 can be electrically connected to other devices through the solder balls 190. The first underfill 180a is disposed between the first chip 120 and the substrate 110 to encapsulate the first conductive bumps 130. The second underfill 180b is disposed between the second chip 140 and the first chip 120 to encapsulate the second conductive bumps 150. The third underfill 180c is disposed between the interposer 160 and the first chip 120 to encapsulate the third conductive bumps 170. In other embodiments, the third underfill 180c may also encapsulate the first chip 120, the second chip 140, the interposer 160, and the third conductive bumps 170 at the same time.

Figure 3:
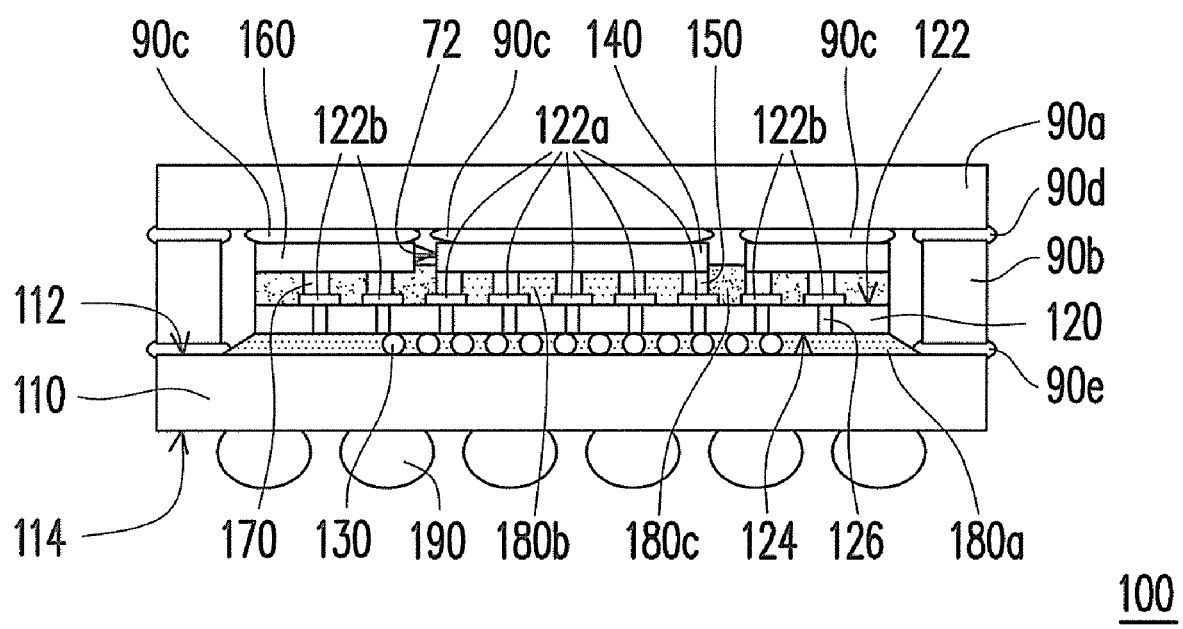
FIG. 3 is a diagram of a semiconductor package structure in FIG. 1K disposed with a heat sink.

FIG. 3 is a diagram of the semiconductor package structure in FIG. 1K disposed with a heat sink. Referring to FIG. 3, after the semiconductor package structure 100 illustrated in FIG. 1K is completed, a thermal conductive ring 90b surrounding the first chip 120 is disposed on the substrate 110. Then, a heat sink 90a is disposed on the package units 80, wherein the heat sink 90a covers and is thermal bonded to the second chip 140 and the interposer 160, and the thermal conductive ring 90b is thermal bonded between the heat sink 90a and the substrate 110. Herein "thermal bonding" refers to a bonding technique that can establish a good thermal conductivity between two devices, wherein other thermal conductive adhesive layers (for example, a thermal conductive adhesive 90d and a thermal conductive adhesive 90e) may be formed between the two devices. In the present embodiment, because the top surface of the interposer 160 is substantially aligned with the top surface of the second chip 140, the second chip 140 and the interposer 160 can support the heat sink 90a together, so that the structure of the entire semiconductor package structure 100 is made very steady.

Additionally, a thermal conductive adhesive 90c may be further formed between the heat sink 90a and the second chip 140 and between the heat sink 90a and the interposer 160 to secure the heat sink 90a. The heat produced by the semiconductor package structure 100 is conducted to the heat sink 90a through the thermal conductive ring 90b and the thermal conductive adhesive 90c to be dissipated. In the present embodiment, besides being adopted for dissipating heat, the semiconductor package structure 100 is further grounded via the heat sink 90a. In other embodiments, the heat sink 90a may also come in other style. For example, the heat sink 90a may be formed integrally with the thermal conductive ring 90b, or the heat sink 90a may be disposed without the thermal conductive ring 90b.

In summary, in a semiconductor packaging process provided by the present invention, an interposer wafer is disposed on a portion of a semiconductor wafer that is exposed by a plurality of second chips, so that the structural strength of the semiconductor package structure is improved and deformation of the semiconductor wafer caused by stress variation is avoided. Moreover, the semiconductor package structure has interposers formed by cutting the interposer wafer, wherein the interposers surround the second chips and support a heat sink together with the second chips, so that the structural strength of the semiconductor package structure is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure, comprising:
   a substrate, having a carrying surface and a bottom surface opposite to the carrying surface;
   a first chip, disposed above the carrying surface of the substrate, wherein the first chip has a first surface and a second surface opposite to the first surface, the second surface faces the substrate, the first chip has a plurality of through silicon vias (TSVs) and a plurality of first pads and a plurality of second pads on the first surface, and the first pads are electrically connected to the corresponding TSVs;
a plurality of first conductive bumps, disposed between the first chip and the substrate, wherein the TSVs of the first chip are respectively electrically connected to the substrate through the first conductive bumps;
a second chip, disposed above the first chip, and exposing a portion of the first surface;
a plurality of second conductive bumps, respectively disposed on the first pads, wherein the second chip is electrically connected to the corresponding TSVs through the second conductive bumps;
an interposer, disposed above the first chip and within the portion of the first surface, wherein a top surface of the interposer is substantially aligned with a top surface of the second chip; and
a plurality of third conductive bumps, respectively disposed on the second pads, wherein the interposer is bonded to the second pads through the third conductive bumps.

2. The semiconductor package structure according to claim 1, wherein a side surface of the interposer is substantially aligned with a side surface of the first chip.

3. The semiconductor package structure according to claim 1 further comprising:
a first underfill, filled between the first chip and the substrate, for encapsulating the first conductive bumps.

4. The semiconductor package structure according to claim 1 further comprising:
a second underfill, filled between the second chip and the first chip, for encapsulating the second conductive bumps.

5. The semiconductor package structure according to claim 1 further comprising:
a third underfill, filled between the interposer and the first chip, for encapsulating the third conductive bumps.

6. The semiconductor package structure according to claim 1 further comprising:
a plurality of solder balls, disposed on the bottom surface of the substrate.

7. The semiconductor package structure according to claim 1 further comprising:
a heat sink, covering and thermal bonded to the second chip and the interposer.

8. The semiconductor package structure according to claim 7 further comprising:
a thermal conductive ring, disposed on the substrate, surrounding the first chip, and thermal bonded between the heat sink and the substrate.

9. A semiconductor packaging process, comprising:
providing a semiconductor wafer, wherein the semiconductor wafer has a second surface, and the semiconductor wafer has a plurality of TSVs;
forming a plurality of first conductive bumps on the second surface, wherein the first conductive bumps are respectively electrically connected to the TSVs;
thinning the semiconductor wafer from an opposite side of the second surface to expose one end of each of the TSVs and a first surface of the semiconductor wafer;
forming a plurality of first pads and a plurality of second pads on the first surface, wherein the first pads are electrically connected to the corresponding TSVs;
bonding a plurality of second chips to the first surface of the semiconductor wafer, wherein each of the second chips is connected to the corresponding first pads through a plurality of second conductive bumps;
forming a second underfill between each of the second chips and the semiconductor wafer, wherein the second underfill is formed on the semiconductor wafer before each of the second chips is bonded to the semiconductor wafer or is filled between each of the second chips and the semiconductor wafer after each of the second chips is bonded to the semiconductor wafer, and the second underfill encapsulates the second conductive bumps;
bonding an interposer wafer to the first surface of the semiconductor wafer, wherein the interposer wafer has a plurality of openings respectively corresponding to and exposing the second chips, the interposer wafer is electrically connected to the corresponding second pads through a plurality of third conductive bumps, and a top surface of the interposer wafer is substantially aligned with top surfaces of the second chips;
simultaneously cutting the interposer wafer and the semiconductor wafer to form a plurality of package units, wherein the semiconductor wafer is cut into a plurality of individual first chips, and the interposer wafer is cut into a plurality of individual interposers; and
bonding the package units to a substrate, wherein the TSVs of the first chips are electrically connected to the substrate through the corresponding first conductive bumps.

10. The semiconductor packaging process according to claim 9 further comprising:
forming a first underfill between the first chips and the substrate, wherein the first underfill is filled between the first chips and the substrate after the first chips are bonded to the substrate, and the first underfill encapsulates the first conductive bumps.

11. The semiconductor packaging process according to claim 9 further comprising:
forming a third underfill between the interposer wafer and the semiconductor wafer, wherein the third underfill is formed on the semiconductor wafer before the interposer wafer is bonded to the semiconductor wafer or is filled between the interposer wafer and the semiconductor wafer after the interposer wafer is bonded to the semiconductor wafer, and the third underfill encapsulates the third conductive bumps.

12. The semiconductor packaging process according to claim 9 further comprising:
disposing a heat sink on the package units, wherein the heat sink covers and is thermal bonded to the second chips and the interposer.

* * * * *